Figure 1:
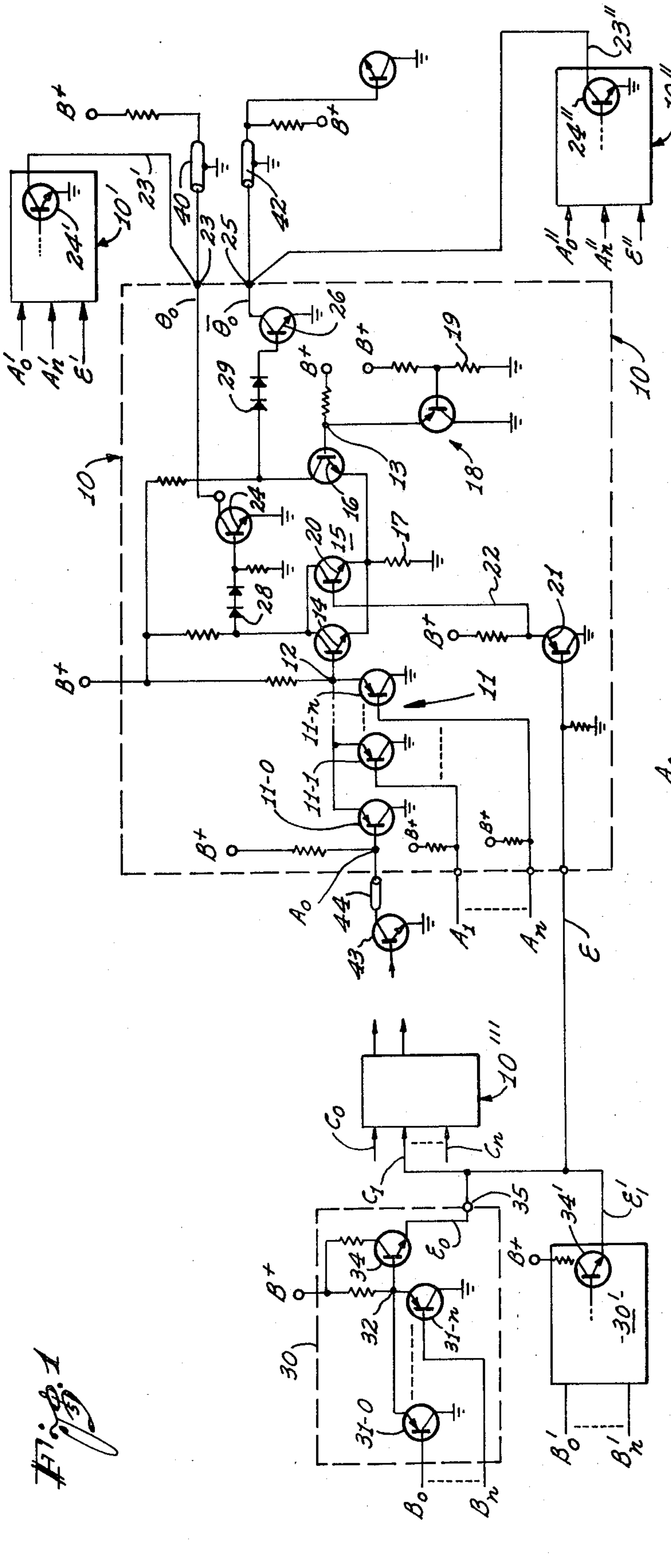

INVENTORS:
Gene B. Potter
Ronald Holt Reeder
By Smyth, Roston & Pavitt
ATTORNEYS

DIGITAL CIRCUIT LOGIC

The present invention relates to logic circuit implementation, designed particularly but not restricted to be used in integrated circuitry. Particularly, the invention relates to a new logic circuit family, capable of realizing AND, OR, NAND and NOR functions.

Logic circuits, particularly integrated circuit logic units have several general characteristics which are dictated by operational requirements, contemplated use and physics of the components. The logic gate receives several inputs and provides one or several outputs in response thereto, to be used in one or more destination circuits, possibly likewise logic gates, bistables devices, etc.

Fan-in of a gate defines the number of inputs it is designed to have; the fan-out refers to the number of different circuits the gate is capable of driving simultaneously. Thus, the switching behavior of a gate does not only depend upon its own input, but also on the input characteristics of the several circuits coupled to its output, and on the number of such circuits. These latter circuits appear in parallel to the output of the gate. Large fan-out capabilities are usually desired.

The inputs of a gate each vary in between two signal levels, and the output of the gate must likewise vary between these two levels. As the output drive element of a gate (e.g. a transistor) is usually operated between cutoff and saturation, its impedance change must be sufficient to establish sufficient signal level differential across all of these impedances of the circuit coupled to the output.

Noise in the system provides disturbance of signal level as effective in the inputs. Therefore, the gate must provide level restoration, and does not merely transmit algebraically combined and amplified inputs. The gate has threshold behavior in that an input below the threshold is regarded as one signal level (usually "0"), an input above the threshold is interpreted as the other level in representation of the opposite logic state (e.g. "1"). The voltage swing between levels must be selected to be sufficiently large to overcome the noise margin, which is the maximum noise voltage that can be superimposed upon an input signal without causing a change of state (traverse of threshold). There is an upper noise margin and a lower noise margin which are not necessarily equal. Temperature change is an additional source for signal level distortions, as junction characteristics in semiconductors have a high dependency upon temperature.

Each logic gate exhibits a propagation delay which is usually the result of charging and/or discharging internal capacities. The effective propagation delay, however, depends also on signal rise time and is, therefore, dependent upon the voltage swing spread. Each gate dissipates a certain amount of electrical energy which should be low as it affects temperature.

There are several different logic circuit families known at the present time, which are related to some extent, but they differ quantatatively as to the several general characteristics outlined above. Moreover, each of them has certain limitations and undesirable features.

Among the more common circuits is the so-called DCTL (direct coupled transistor logic) circuit variety, wherein the several logic inputs connect to the base electrodes of a corresponding number of transistors, operated in common emitter configuration and having interconnected collectors which, in turn, control the base of an output transistor, also in common emitter configuration.

Among the disadvantages of that family, is the so-called current hogging, as one of the transistors may draw most of the current if its base-emitter voltage is slightly lower than the others connected in parallel. As a consequence, fan-out is rather low. This has been counteracted by connection of series resistors in each logic input path as leading to a base electrode and the thus modified family is called RTL (resistor transistor logic). RTL circuits permit larger fan-out, however, they have a higher propagaion delay, i.e., low switching speed, as the input capacitance of the transistors must be charged via series resistors. Inclusion of parallel capacitors in the input circuits increase operating speed, but for IC techniques, the large amounts of capacitors needed is detrimental, as they occupy too much space.

Another family is called DTL (diode transistor logic), wherein each input path runs through a diode. These have, for example, interconnected anodes, leading via a diode to the base of a transistor in common emitter circuit. Due to employment of diodes, the voltage swing has to overcome diode threshold which is rather high, and temperature variations must be considered additionally. Also, the outputs of two or more such circuits cannot be tied together directly for an "AND" operation, as the circuit per se realizes only the NAND function; its output transistor conducts when all inputs are "1". On the other hand, the complementary output is not directly available, thus, requiring an inverter.

A modification of the DTL family is called TTL or $T^2L$ (transistor-transistor logic) wherein the input signals are individually accepted by plural emitters of a single input transistor. TTL is an improvement over DTL as to space occupancy on an IC chip, having also reduced power consumption and lower threshold, but otherwise the disadvantages are the same. Also, the circuit has little gain in the input stages.

Another family of circuits is called ECL (emitter coupled logic). The base electrodes of several transistors receive the respective inputs. These emitters are interconnected, there being a common emitter resistor; the collectors are likewise interconnected and control an output transistor. The emitter of a reference transistor is connected to said interconnected emitters, and the base of the reference transistor receives a a reference voltage, while its collector controls another output transistor. This is the only family that does not need a full 4 to 5 volt input signal swing (nominal) for distinguishing between 0 and 1. Also, complementary outputs are available and there is some temperature compensation. However, ECL does not permit AND-OR expansion and has very little noise margin.

It is an object of the present invention to provide a logic family, that has the following characteristics, features, and advantages. For reasons of speed, the voltage swing should be as small as possible, e.g. as low as 2 volts. Still, the output stage should be overdriven so that its small signal gain is zero. The circuit should have significant gain and be rather independent from temperature variations, permitting a wide environmental temperature range. The input impedance should be high, and these should be some gain to permit logic signal level restoration and high fan out. In order to minimize power dissipation on an IC chip without requiring two different d.c. power supplies (i.e. two instead of one power input pins), the output stages should be common emitter stages. Further, NPN transistors are inherently superior to PNP transistors because mobility of electrons is better than of holes so that the output stage in a logic circuit should be a common emitter NPN transistor. It follows that the output signal should be "high" for a logic "1" so that the outputs of several circuits can be tied together directly to obtain an AND function. The input should permit AND-OR expansion. The circuit has to work in a transmission line environment, with 50 to 70 ohms line impedance. The circuit should have complementary outputs available directly, without cascading of inverting stages. Note, that AND gating of outputs of several stages requires such independence of complementary outputs. The logic circuit that is the object of this invention, realizes these characteristics, features and advantages not all found in the known circuits.

In accordance with the preferred embodiment of the invention, it is suggested to provide a plurality of transistors of a first type. In case the circuit is realized on an IC chip of basis p-type conductivity, these transistors should be of the PNP type. The collectors or these transistors are connected to or they constitute part of the IC substrate, thereby establishing common collector circuits. The base electrodes of these transistors are provided to accept the several input signals for the gate. The emitters of the input transistors are interconnected and connected to the base of a transistor of the opposite type (e.g., NPN), that base being resistively biased to a particular, e.g., positive potential, in case this transistor is indeed of the NPN type.

The last mentioned transistor as controlled by all input transistors pertains to a differential amplifier, having a second transistor of similar type, (e.g., NPN). and the two emitters of the two transistors of this differential amplifier are connected to ground or substrate via a resistance type current source. The base electrodes of the second transistor of the differential amplifier is connected to the emitter of a reference transistor of the first type, (e.g., PNP). The reference transistor is comparable to the transistors of the input group and is also connected in collector configuration and having resistively biased emitter and base. The base bias circuit of the reference transistor includes a voltage divider which determines the operating point for switching conduction between the transistors of the differential amplifier. In essence, the voltage divider establishes the switching threshold of the gate. Output transistors of the second type, (e.g. NPN), and in common emitter circuit, have respectively their base electrodes connected to the collectors of the transistors of the differential amplifier. Complimentary outputs are taken from the collectors of these two output transistors.

Preferably, the differential amplifier includes a third input transistor, having its collector emitter path connected directly across collector and emitter of the first transistor and being of the same type, (e.g. NPN). That third transistor has its base connected to the resistively biased emitter of a further transistor of the first type (e.g. PNP) in common collector configuration and whose base establishes an OR-expansion point of the gate.

As the input transistors each are connected in common collector configuration, there is significant current gain, at high input impedance, so that the input current is quite low. As that input current may be controlled from the output of a circuit of like configuration, significant fan out is possible. The differential amplifier configuration is self-compensating, as to temperature variations. The outputs are "high" if representing a "1", i.e., the respective output transistor when providing a "1" is nonconductive, so that its collector can be connected directly to the output of another, similar logic gate, for AND-gating therewith. Complementary outputs are directly available and the OR-expansion point does not introduce difficulties into the circuit as to stability.

Figure 2:
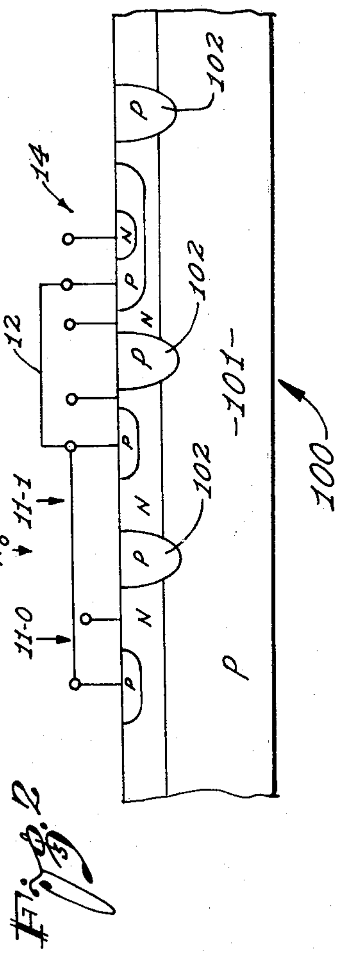

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 illustrates schematically a circuit diagram partially a block diagram of a logic circuit in accordance with the preferred embodiment of the invention, and FIG. 2 illustrates a section view of a portion of an IC chip realizing the circuit shown in FIG. 1.

Proceeding to the detailed description of the drawings, in FIG. 1 thereof is shown an integrated logic circuit 10 which establishes concurrently AND and NAND functions of plural inputs, OR/NOR functions of the logical product of the plural inputs and of an OR expander input, and AND functions as to signals tied directly to the outputs of unit 10. The plural inputs to logic unit 10 are denoted $A_o \ldots A_n$, as they are applied to terminals of like designation. Basically, it is assumed for reasons of generality that the input signals are developed independently from each other. The circuit is biased by voltage taken from a source of positive potential $B^+$, relative to IC substrate potential assumed to establish ground. The driving voltage may be about 2 volts.

The input signals are applied individually to the respective base electrodes of PNP transistors 11–o . . . 11–n, wherein *n* is a suitable integer, for example three. The emitter electrodes of all these transistors are interconnected to establish a terminal 12 that is resistively connected to $B^+$. The collector electrodes of the transistors of the input group 11 are connected to ground. Thus, the inputs $A_o \ldots A_n$ are applied to individual transistors which are controlled in common collector configuration.

As shown in FIG. 2, the collectors of these PNP transistors 11 are actually merging into the P-zone substrate 101 of the IC chip 100, and they are separated therein by heavily P-doped, surface array zones 102, penetrating the N-layer 103 above substrate 101. Layer 103 establishes the base zones for the transistors 11. This choice is significant as a P-type substrate is the type commonly used for IC elements.

As the inputs $A_o \ldots A_n$ are applied to the respective base electrodes of the input transistors 11, there is already significant signal current gain in the input stage because of the common collector configuration, requiring only relatively low input signal swing. This is advantageous, if sources producing these input signals, have themselves high fan out. Also, the high input impedance of the base circuit minimizes current dumping in the input circuit and current hogging of one input circuit is impossible. As will be shown below, the response threshold is chosen to be quite low in this configuration.

The input signals are presumed to have polarity positive to ground or substrate for a logical "1", in the following also termed a "high" input. Accordingly ground, or near ground potential is a "low" input representing a logical "0". Thus, an NPN transistor of the input group 11 is nonconductive on a logical "1", but conductive on a logical "0". The potential of the interconnect terminal 12 of the several emitters of transistors 11 is low as long as at least one transistor of the input group 11 is conductive due to a low input. It should be noted, that the transistors of input group 11 should never saturate in order to prevent long storage time propagation delays. If all inputs of the group are high, none of the transistors of group 11 conducts, and the interconnect terminal 12 for the emitters remains high.

The terminal 12 is one input terminal of a differential amplifier 15 composed of PNP transistors 14 and 16. These transistors are connected and operated in common emitter configuration. The emitters are connected to a common current source 17, such as a resistor that connects to ground. The collectors of transistors 14 and 16 are individually connected to $B^+$ via suitable resistors.

The base electrode of transistor 16 constitutes the second input terminal 13 for the differential amplifier 15. That second input terminal is resistively biased by connection to $B^+$, and is also connected to a reference transistor 18 of the PNP type. The base electrode of transistor 18 is connected to a voltage divider 19 that connects between $B^+$ and ground, to establish a reference level of intermediate value as to conduction through transistor 18. As a consequence, the base of transistor 16 is biased to obtain conduction at saturation by operation of emitter bias for a low signal in terminal 12 that renders transistor 14 nonconductive. As transistor 14 shifts to conduction because the input on terminal 12 is higher than the base potential for transistor 16 as established by the emitter of transistor 18, transistor 16 is cut off due to emitter bias as controlled from saturated transistor 14.

The collector electrode of transistor 14 is connected to the base electrode of a first output transistor 24, coupled thereto via isolation diodes 28. This transistor 24 is also a NPN transistor, controlled in common emitter configuration. The collector electrode of transistor 24 leads to a first output terminal 23 of the logic unit 10.

Other connections will be discussed below, but for completion of description of unit 10, it must be mentioned that there is a transmission line connection 40 that leads from a suitable output pin of the IC chip to a different chip, which is possibly mounted on a different circuit module. $B^+$ is resistively applied to the remote end of that low impedance transmission line (30 to 300 ohms), so that the potential of terminal 23 is still very close to the 2 volts of the $B^+$ biasing source, as long as transistor 24 is nonconductive.

Transistor 24, when conductive, conducts at saturation with a small signal gain of zero, its output representing a "0" in this case. Transistor 24 is conductive only when transistor 14 is cut off, so that $B^+$ potential is applied via diodes 28 to the base of transistor 24. This, in turn, occurs when the potential of terminal 12 is low because at least one of the transistors 11 is conductive.

On the other hand, the collector output of transistor 24 is "high", representing a logical "1", when transistor 14 is nonconductive because transistor 16 conducts. The impedances in the base circuit for transistor 24 and in the emitter circuit for transistor 14 are chosen, so that for conduction through transistor 14 its collector has about 1.5 volt potential above ground, insufficient to overcome the serially effective thresholds of diodes 28 for rendering transistor 24 conductive. Transistor 14 conducts only, when the potential in 12 is high. This is true in case all of the inputs $A_o \ldots A_n$ are high in representation of "1's". Thus, the collector output of transistor 24 realizes the logic AND function of inputs $A_o, \ldots, A_n$; $\theta = (A_o \cdot A, \cdot \ldots \cdot A_n)$.

Analogously, there is an output transistor 26, likewise of the NPN type and connected in common emitter configuration. The base electrode of transistor 26 is connected via diodes 29 to the collector of transistor 16. The collector of transistor 26 establishes a second output of unit 10, and is connected to $B^+$ via the transmission line 41.

As long as the input voltage at terminal 12 is higher (because all inputs $A_o \ldots A_n$ are high), than the input voltage at terminal 13, transistor 14 is conductive, so that the common emitter bias on amplifier 15 causes transistor 16 to turn off. With transistor 16 in the off state, transistor 26 is conductive at saturation and its output is low. Conversely, if one (or more) of the inputs $A_o \ldots A_n$ is low so that the respective transistor of the input group 11 conducts, transistor 14 is cut off and transistor 16 conducts at saturation lowering its collector potential below threshold of diode 29 so that transistor 26 is cut off and the output at terminal 25 is high. Accordingly the output derivable from terminal 25 is the logic NAND function of all inputs, $\overline{\theta} = A_o \cdot A, \ldots A_n$.

It should be noted that AND and NAND functions are derived from the circuit concurrently and independently, i.e., not by inversion of one output for producing the other. This means that terminal 23 or 25, whichever is high for reasons of non-conduction of the respective output transistor, is free to assume a different potential without affecting the respective other output of the unit.

Before considering the various additional logic operations of which gating unit is capable, the particular operating condition of the gate shall be discussed in some detail. Moreover, employment of a low driving and biasing voltage (2 volts) shall be justified as permissible and sufficient, and the operating threshold level shall be evaluated.

Considering that the logic input signals are themselves produced by gating structure or by IC flip-flops of basically similar design as to their respective output circuit, it appears that any "low" input signal (e.g. $\overline{A}_o=1$ etc.) results from connection of the particular input terminal (that is to receive that signal) to ground or substrate via a saturated transistor. By way of example, FIG. 1 illustrates production of signal $A_o$ by operation of a transistor 43 in common emitter configuration and pertaining a controlled output stage. The collector of transistor 43 connects via transmission line 44 to the base electrode of transistor 11–0. In the overdriven state of transistor 43 and due to voltage drop in transmission line 44, the "low" level potential for signal Ao may, under worst case conditions, be about 0.4 volts above ground potential. It is desirable and practical to design a logic system with a 0.5 volt noise margin. Thus, a signal at an input terminal of up to 0.9 volts, must still be recognized as a "low" signal equivalent of a logical zero.

In view of the gain of transistor 11 in the common collector configuration, only 100 mV input signal level change is needed to bridge the sloping characteristics of transistor 11–0 from cut off to the half point between cut off and saturation.

Thus, an input of up to 1 volt should actually be recognized as a "0". This level establishes a particular potential on terminal 12; the same potential on terminal 13 will define the operating threshold for the differential amplifier 15. As reference transistor 18 is similar to input transistors 11 (they are on the same chip and made by the same process!) the switch level for the differential amplifier corresponds to a 1-volt adjusted bias for the base of transistor 18 by operation of divider 19.

In addition, a −10 percent tolerance for $B^+$ must be considered so that resistors 19 are actually adjusted to a 1.1 volt level to establish the nominal threshold response level for the gate. Thus, an input signal such as $A_o$ must exceed 1.1 volts to be recognized as a "-high" input, below that level it will be recognized as a "low" input.

Considering now the tolerance levels for a high input, one should begin with the established nominal threshold of 1.1 volts as a reference. The input signal must exceed again a +10 percent tolerance in the $B^+$. Moreover, an input level change of 100 mV on basis of the existing gain must be considered again, to bridge the range between the above mentioned half point and full saturation of any of the input transistors 11. There is also a 0.5 noise margin, establishing a lower boundary for the upper signal of about 1.8 volts. A −10 percent tolerance must be permitted in the collector bias for each of the output transistors 24 and 26. As a consequence of these various levels, an upper nominal signal level of 2 volts is obtained, which accordingly is the lowest permissible level of the supply voltage.

In view of the relative high gain in a gate and in view of the temperature balance as provided by the differential amplifier, a nominal voltage level swing higher than 2 volts is not needed, as temperature variations do not affect the operating, nominal threshold. However, if for any reason the noise margin is higher, operating voltage must be increased accordingly. It is pointed out, however, that the 4 volts (and above) needed for the conventional logic circuits take also only 0.5 volt noise margin or less into account (twice).

It can be seen, that the operating voltage could be reduced further if the noise margin were lower, as the total margin for upper and lower operation levels amounts to 1 volt. Also, in case of lower tolerance in $B^+$ (concurrently assumed above to be ± 10 percent), a further voltage swing reduction would be permissible.

I now turn to the description of the various additional logic operations, and here particularly, to the OR expansion.

A NPN transistor 20 has its collector-emitter path connected across the collector-emitter path of transistor 14. The base electrode 22 of transistor 20 is connected to the collector of an input transistor 21 whose base electrode establishes the OR expansion point E. It is important that input transistor 21 is also of the PNP type, i.e. of the same type as the transistors of the input group 11. Transistor 21 is nonconductive when the OR expansion input E is high, in which case transistor 20 is conductive. In essence, base 22 of transistor 20 is an alternative input for that side of differential amplifier 15, overriding, when conductive, any control of the differential amplifier by and as derived from terminal 12.

In case input signal E is high, transistor 21 is nonconductive causing transistor 20 to be conductive, forcing transistor 16 and 24 to turn off irrespective of the state of conduction of transistor 14. Thus, the output terminal 23 is high for $E=1$. For $E=0$, transistor 21 conducts, to cut off transistor 20. Thus, control of terminal 12 by the inputs $A_o \ldots A_n$ prevails in this case. In full expansion, therefore, unit 10 realizes $\theta=E+(\overline{A_o \cdot A_1 \cdot \ldots \cdot A_n})$ as well as $\overline{\theta}=\overline{E+(A_o \cdot A_1 \cdot \ldots \cdot A_n}=\overline{E}\cdot(\overline{A_o \cdot A_1 \cdot \ldots \cdot A_n})$, the latter being the NOR function of input E and of the logical product $(a_o \cdot A_1 \cdot \ldots \cdot A_n)$.

All these elements as described are conveniently placed on one IC chip, suitably packaged to serve as multi purpose AND/NAND/OR/NOR gate. Leaving E floating, the multi purpose unit 10 is a AND/NAND gate. Leaving $A_1$ to $A_n$ floating, the unit is a two input OR/NOR gate for $A_o$ and $E$.

The potentials at terminals 23 and 25 are respectively high for a logic "1". Thus, they can be AND-gated with similarly produced outputs of other logic gates. It is assumed presently that a unit 10' is a similar, multi purpose gating unit having inputs $E'$, $A'_o, \ldots, A'_n$ and having an AND-function output terminal 23' to realize a high or low signal $\theta_1$. The representative circuit in FIG. 1 shows terminals 23 and 23' interconnected directly.

Assuming the respective output transistor 24' in unit 10' is nonconductive ($\theta = 1$), terminal 23 remains under control of transistor 24 of unit 10. If the latter transistor is also nonconductive ($\theta_o = 1$), terminal connection 23–23' realizes the function $\theta_o \cdot \theta 1$, solely by operation of the units which produce signals $\theta o$ and $\theta 1$ individually. Verifying the foregoing, consider transistor 24 is rendered conductive for $\theta o = 0$. In this case, terminal 25 is connected to ground, regardless of the state of conduction of transistor 24' in unit 10'. Thus, interconnected terminals 23–23' realize a logic function that reads: $(A_o \cdot A_1 \cdot \ldots \cdot An + E) \cdot (A'_o \cdot A'_1 \cdot \ldots A'_n + E')$.

As the outputs 23 and 25 of a gating unit, such as 10, are symmetrically constructed and obtain logic meaning only as to their particular inputs, they are equivalent as to connection to other outputs. Thus, output terminal 25 realizing the NAND/NOR-function of the inputs of unit 10, is shown to be connected to output 23'' of a unit 10'', producing a signal $\theta 2$. Accordingly, the interconnected output terminals 25–23'' realize the function $\overline{\theta o} \cdot \theta 2$.

A supplemental unit 30 will be described next. For reasons of analogy, this unit is comprised of $m+1$ input transistors of the PNP type 31–0 to 31–m, in common emitter circuit with interconnected collectors, to establish a terminal 32. The base electrode of NPN transistor 34 is connected to that terminal. Base and collector electrodes of transistor 34 are resistively connected to B+ and its emitter establishes an output terminal 35. The output signal is termed $E_o$.

Unit 30 is incomplete per se as it does not provide signal level restoration, but it is destined for connection, for example, to an input terminal such as C 1 of unit 10'''. The drawing shows also that this particular terminal 35 is connected to OR expansion terminal E of unit 10. Terminal 32 is high upon $B_o = B_1 = \ldots B_n = 1$ so that transistor 34 is conductive. Signal $E_o$ is defined to be equal to $(B_o{\cdot}B_1{\cdot} \ldots {\cdot}B_n)$. Thus, terminal $E_o = E$ and transistor 21 is rendered nonconductive. It follows that in the supplemented configuration units 10 and 30 together realize the functions $\theta = A_o{\cdot}A, {\cdot\cdot}A_n) + (B_o{\cdot}B_1 {\cdot\cdot} B_m)$, as well as $\overline{\theta} = (A_o{\cdot}A_1{\cdot\cdot}A_n) \cdot (B_o{\cdot}B_1{\cdot\cdot}B_m)$.

Another unit 30' of similar type has input terminals $B'_o, \ldots, B'_m$ and output terminal 35' providing output signal $E'$. Unit 30' has the emitter of its output transistor 34' connected also to that terminal $E$, and the logic combining operation is as follows. Transistor 34 is conductive on $B_o = B_1 = \ldots B_m = 1$, $E_o = 1$. Analogously, transistor 34' is conductive on $B'_o = \ldots = B'_m = 1$, $E_1 = 1$. $E = 1$, cuts off transistor 21 in unit 10. Transistor 21 is rendered conductive only, if transistor 34 and transistor 34' are nonconductive, leaving the respective emitters floating. Thus, $E = 0$ is true only on $E_o = E_1 = 0$. Consequently, the direct interconnecting of output terminals 35 and 35' and their interconnection to an expansion point $E$, realizes the OR function $E = E_o + E_1$.

Thus, merely by connecting output terminals of supplementing units of the type 30 to an OR expansion gate realizes multiple OR functions. In the present example, it follows that $\theta = A_o{\cdot} \ldots {\cdot}A_n) + (B_o, \ldots {\cdot}B_m) + (B'_o{\cdot} \ldots {\cdot}B'_m) {\cdot}\theta_2$.

The invention is not limited to the embodiment described above but all changes and modifications thereof not constituting departures from the spirit and scope of the invention are intended to be included.

We claim:

1. A transistorized multipurpose logic gating unit receiving a plurality of different logic signals, each signal varying over a substantially similar range, for establishing a first logic level when below a particular level in that range, and a second logic level when above the particular level, comprising:

a plurality of transistors of a first type, having common collector circuit with interconnected collectors and connection thereof to ground, and further having interconnected emitters to establish a first terminal, the base electrodes of the transistors of the plurality connected to individual terminals establishing individual logical input terminals for respectively receiving the signals of the plurality;

means for biasing the first terminal to assume a first potential level in case none of the transistors of the plurality is conductive, and a second level, somewhat closer to ground potential in case at least one transistor of the plurality is conductive;

a differential amplifier including a pair of transistors of the opposite type, having interconnected emitters and separately biased collectors, the base electrode of a first transistor of the pair connected to said first terminal;

a biasing circuit including a reference transistor of the first type connected in common collector configuration and having its emitter connected to the base electrode of the other one of the pair, further including a resistance means connected to bias the base electrode of the reference transistor to a potential equal to said particular level for obtaining a bias of the base electrode of the other one of the pair intermediate to the first and second levels; and a pair of output transistors of the first type, in common emitter configuration and having respectively their base electrodes connected to the collector electrodes of the pair of the differential amplifier.

2. A multi purpose gating unit as set forth in claim 1, including a transistor (a) of the second type having its emitter-collector path connected across the emitter-collector path of the first one of the pair included in the differential amplifier, further including a transistor (b) of the first type connected in common collector configuration and having its emitter resistively biased as well as connected to the base electrode of the transistor (a), the base electrode of the transistor (b) establishing an OR-expansion terminal for the unit.

3. A multi purpose gating unit as in claim 2, including a second plurality of transistors of the first type in common collector configuration, interconnected emitter electrodes and individual base electrodes as individual input terminals;

an output transistor of the second type, having its base electrode connected to the interconnected emitter electrodes of the plurality, the base and the collector of the latter output transistor resistively biased to potential different from ground, the emitter of the output transistor connected to said expansion terminal.

4. A gating unit as in claim 1, there being diode means interposed between the collector electrodes of the transistors of the differential amplifier, and the base electrodes of the pair of output transistors.

* * * * *